US012683610B2

(12) United States Patent     (10) Patent No.:   US 12,683,610 B2

Lee                          (45) Date of Patent:         Jul. 14, 2026

(54) TRANSMISSION AND RECEPTION SYSTEM AND SEMICONDUCTOR APPARATUS USING THE TRANSMISSION AND RECEPTION SYSTEM

(71) Applicant: SK hynix Inc., Icheon-si (KR)

(72) Inventor: Hyun Bae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 160 days.

(21) Appl. No.: 18/627,653

(22) Filed: Apr. 5, 2024

(65) Prior Publication Data

US 2025/0150079 A1     May 8, 2025

(30) Foreign Application Priority Data

Nov. 6, 2023    (KR) ........................ 10-2023-0151912

(51) Int. Cl.
     *H03K 19/0185*      (2006.01)
     *H03K 3/017*       (2006.01)
     *H03K 19/20*       (2006.01)

(52) U.S. Cl.
     CPC ..... *H03K 19/018507* (2013.01); *H03K 3/017* (2013.01); *H03K 19/20* (2013.01)

(58) Field of Classification Search
     CPC ........... H03K 19/018507; H03K 3/017; H03K 19/20; H03K 19/017509; H03K 19/0185; H03K 5/1565; H04L 7/02; H04L 25/20

USPC ........................................................ 327/175
See application file for complete search history.

(56) References Cited

U.S. PATENT DOCUMENTS

| | | | |
|---|---|---|---|
| 7,888,966 B1 * | 2/2011 | Davidson | ............. G11C 7/1066 |
| | | | 326/62 |
| 8,817,914 B2 | 8/2014 | Shawwa et al. | |
| 10,840,910 B2 | 11/2020 | Kitagawa | |
| 11,923,845 B1 * | 3/2024 | Kronmüller | ..... H03K 3/356182 |
| 2005/0068081 A1 * | 3/2005 | Slawecki | ............... H03K 5/153 |
| | | | 327/267 |
| 2008/0204079 A1 * | 8/2008 | Park | ......................... H03K 3/00 |
| | | | 326/81 |

FOREIGN PATENT DOCUMENTS

KR      1020140080903 A     7/2014

* cited by examiner

*Primary Examiner* — Ryan Jager
(74) *Attorney, Agent, or Firm* — WILLIAM PARK AND ASSOCIATES LTD.

(57) ABSTRACT

A transmission and reception system includes a transmission circuit and a reception circuit. The transmission circuit is configured to generate a transmission signal based on an input signal. The reception circuit is configured to generate an output signal based on the transmission signal. The transmission circuit is configured to provide a duty cycle offset which is complementary with a duty cycle offset of the reception circuit.

25 Claims, 7 Drawing Sheets

100

800

TRANSMISSION AND RECEPTION SYSTEM AND SEMICONDUCTOR APPARATUS USING THE TRANSMISSION AND RECEPTION SYSTEM

CROSS-REFERENCES TO RELATED APPLICATION

The present application claims priority under 35 U.S.C. § 119 (a) to Korean Patent Application No. 10-2023-0151912, filed on Nov. 6, 2023, in the Korean Intellectual Property Office, which is incorporated herein by reference in its entirety.

BACKGROUND

1. Technical Field

Various embodiments generally relate to an integrated circuit technology, and more particularly, to a transmission and reception system and a semiconductor apparatus using the transmission and reception system.

2. Related Art

A semiconductor apparatus includes a plurality of semiconductor chips and/or a plurality of circuits. The plurality of semiconductor chips and/or the plurality of circuits may operate by receiving different power supply voltages. When a signal is propagated through the plurality of semiconductor chips and/or the plurality of circuits, the voltage level of the signal needs to be changed. In general, a level shifter is used in order to change the voltage level of the signal. For example, when a first circuit operates in a first power domain, a second circuit operates in a second power domain, and a signal is provided from the first circuit to the second circuit, the level shifter may change the voltage level of the signal from the first power domain to the second power domain. In contrast, when a signal is provided from the second circuit to the first circuit, the level shifter may change the voltage level of the signal from the second power domain to the first power domain. As the operating speed of the semiconductor system is improved, a signal that is used in a semiconductor system and a semiconductor apparatus may have a higher frequency and smaller amplitude. Accordingly, if a signal is transmitted or received through a typical transmission circuit or reception circuit, or the voltage level of a signal is changed through a typical level shifter, the distortion of a duty ratio or a phase skew may occur in a changed signal.

SUMMARY

In an embodiment, a transmission and reception system may include a transmission circuit and a reception circuit. The transmission circuit may be configured to output a transmission signal based on an input signal. The reception circuit may be configured to generate an output signal by shifting a voltage level of the transmission signal. The transmission circuit may provide a duty cycle offset which is complementary with a duty cycle offset of the reception circuit.

In an embodiment, a transmission and reception system may include a transmission circuit and a reception circuit. The transmission circuit may include a plurality of driver circuits having different duty cycle offsets and each configured to drive an input signal. The transmission circuit may be configured to generate a transmission signal from one of output signals of the plurality of driver circuits based on a transmission control signal. The reception circuit may be configured to shift a voltage level of the transmission signal from a first power supply voltage to a second power supply voltage to generate an output signal.

In an embodiment, a transmission and reception system may include a transmission circuit and a reception circuit. The transmission circuit may be configured to generate a transmission signal based on an input signal. The reception circuit may include a plurality of level shifters having different duty cycle offsets and each configured to shift a voltage level of the transmission signal. The reception circuit may be configured to generate an output signal based on at least one of output signals of the plurality of level shifters.

DETAILED DESCRIPTION

Figure 1:
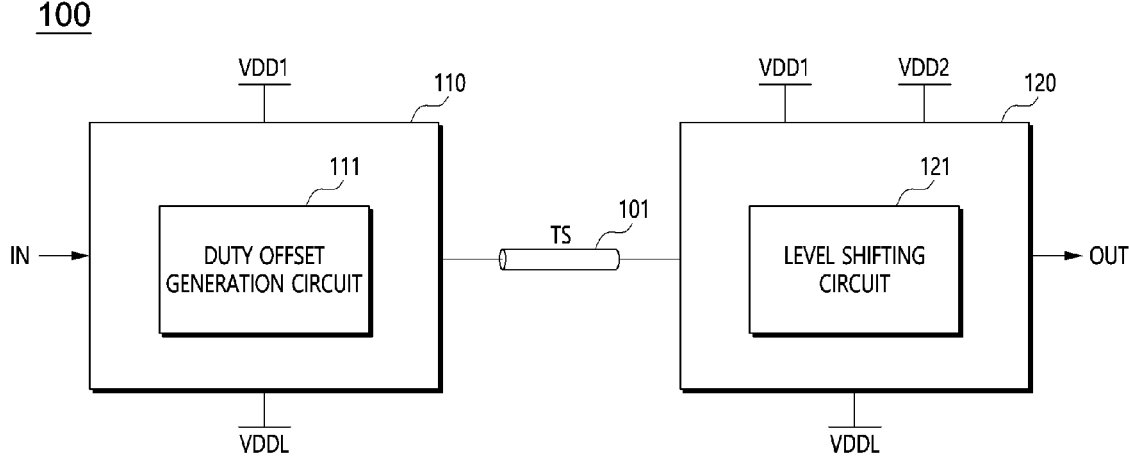
FIG. 1 is a diagram illustrating a configuration of a transmission and reception system according to an embodiment.

FIG. 1 is a diagram illustrating a configuration of a transmission and reception system 100 according to an embodiment. Referring to FIG. 1, the transmission and reception system 100 may include a transmission circuit 110 and a reception circuit 120. The transmission circuit 110 may receive an input signal IN, and may generate a transmission signal TS based on the input signal IN. Each of the input signal IN and the transmission signal TS may be a clock signal that is toggled at a predetermined cycle. In an embodiment, the input signal IN and the transmission signal TS may each be a signal that is synchronized with a clock signal, and may each be a bit stream or symbol which may randomly have a logic level of 0 and 1. The transmission circuit 110 may operate in a first power domain. The transmission circuit 110 may receive a first high power supply voltage VDD1 and a low power supply voltage VDDL. The first high power supply voltage VDD1 may have a higher voltage level than the low power supply voltage VDDL. The first power domain may be a voltage range between the first high power supply voltage VDD1 and the low power supply voltage VDDL. The transmission circuit 110 may generate the transmission signal TS having a voltage level that is changed between the first high power supply voltage VDD1 and the low power supply voltage VDDL by driving the input signal IN.

The transmission circuit 110 may be coupled to the reception circuit 120 through a signal transmission line 101. The transmission circuit 110 may transmit the transmission signal TS to the reception circuit 120 through the signal transmission line 101 by driving the signal transmission line 101 based on the input signal IN. The signal transmission line 101 may be an interconnection, a channel, a link, or a bus as a physical signal path that connects the transmission circuit 110 and the reception circuit 120. In an embodiment, the transmission circuit 110 may be disposed in a first semiconductor chip, the reception circuit 120 may be disposed in a second semiconductor chip, and the signal transmission line 101 may be a signal path that connects the first and second semiconductor chips. In an embodiment, the transmission circuit 110 and the reception circuit 120 may be disposed in one semiconductor chip, and the signal transmission line 101 may be a signal path within the one semiconductor chip.

The reception circuit 120 may be coupled to the transmission circuit 110 through the signal transmission line 101. The reception circuit 120 may receive the transmission signal TS that is transmitted by the transmission circuit 110 through the signal transmission line 101. The reception circuit 120 may generate an output signal OUT based on the transmission signal TS. The reception circuit 120 may operate in a second power domain. The reception circuit 120 may receive a second high power supply voltage VDD2 and the low power supply voltage VDDL. The second high power supply voltage VDD2 may have a higher voltage level than the low power supply voltage VDDL. The second high power supply voltage VDD2 may have a voltage level different from the voltage level of the first high power supply voltage VDD1. The second high power supply voltage VDD2 may have a higher voltage level than the first high power supply voltage VDD1. In an embodiment, the second high power supply voltage VDD2 may have a lower voltage level than the first high power supply voltage VDD1. The second power domain may be a voltage range between the second high power supply voltage VDD2 and the low power supply voltage VDDL. The reception circuit 120 may generate the output signal OUT having a voltage level that is changed between the second high power supply voltage VDD2 and the low power supply voltage VDDL by driving the transmission signal TS. The reception circuit 120 may convert the transmission signal TS that is generated in the first power domain into a signal having the second power domain. To change the power domain of the transmission signal, the reception circuit 120 may further receive and use the first high power supply voltage VDD1. The reception circuit 120 may be configured to shift a voltage level of the transmission signal TS to generate an output signal OUT. For example, the reception circuit 120 may include a level shifting circuit 121. The level shifting circuit 121 may convert the transmission signal TS having a voltage level between the first high power supply voltage VDD1 and the low power supply voltage VDDL to a signal having a voltage level between the second high power supply voltage VDD2 and the low power supply voltage VDDL.

The transmission circuit 110 and the reception circuit 120 may each have a duty cycle offset depending on a physical and/or environmental factor. The duty cycle offset may refer to a direction of change in the duty cycle and/or amount of change in the duty cycle. In an embodiment, when the input signal IN has a duty cycle of 50%, the transmission circuit 110 may generate the transmission signal TS having a duty cycle of 50%. The duty cycle of 50% may represent that the ratio of the unit interval of a high level and the unit interval of a low level is 1:1. For example, the duty cycle of 50% may represent that the lengths of the high level interval and low level interval of a clock signal are the same. When the duty cycle is increased, this may represent that the duty cycle becomes greater than the duty cycle of 50% and that the unit interval of a high level becomes longer than the unit interval of a low level. When the duty cycle is decreased, this may represent that the duty cycle becomes smaller than the duty cycle of 50% and that the unit interval of a low level is longer than the unit interval of a high level. Practically, the transmission circuit 120 may have a duty cycle offset, and may generate the transmission signal TS having a duty cycle that is greater than or smaller than 50% although the input signal IN has a duty cycle of 50%. Likewise, the reception circuit 120 may have a duty cycle offset, and may generate the output signal OUT having a duty cycle that is greater than or smaller than 50% although the transmission signal TS has a duty cycle of 50%. In an embodiment, then the duty cycle of the output signal OUT is not 50%, there is possibility that a malfunction may occur in another internal circuit that operates based on the output signal OUT. In an embodiment, the malfunction may decrease the reliability of a semiconductor apparatus. The transmission circuit 110 and the reception circuit 120 may perform a duty cycle adjustment operation to generate the output signal OUT having a duty cycle of 50%.

The transmission circuit 110 may provide a duty cycle offset which is complementary with duty cycle offset of the reception circuit 120. The transmission circuit 110 may include a duty offset generation circuit 111 to provide the complementary duty cycle offset. The duty offset generation circuit 111 may selectively change the duty cycle of the input signal IN. The duty offset generation circuit 111 may generate the transmission signal TS having substantially the same duty cycle as the input signal IN without changing the duty cycle of the input signal IN. In other words, the duty offset generation circuit 111 might not change the duty cycle of the input signal IN to generate the transmission signal TS. The duty offset generation circuit 111 may generate the transmission signal TS having a duty cycle different from the duty cycle of the input signal IN by adjusting the duty cycle of the input signal IN. Whether the duty offset generation circuit 111 performs a duty adjustment operation may be determined in association with the duty cycle offset of the reception circuit 120. For example, when the reception circuit 120 does not inherently have a duty cycle offset or when the duty cycle offset of the reception circuit 120 is complementary to an inherent duty cycle offset of the transmission circuit 110, the duty offset generation circuit 111 might not perform a duty cycle adjustment operation. When the duty cycle offset of the reception circuit 120 is complementary to the duty cycle offset of the transmission circuit 110, a change in the duty cycle that occurs in the reception circuit 120 may cancel a change in the duty cycle that occurs in the transmission circuit 110. When the reception circuit 120 has a duty cycle offset and the duty cycle offset of the reception circuit 120 and the duty cycle offset of the transmission circuit 110 are different from each other, the transmission circuit 110 may perform a duty cycle adjustment operation. The duty offset generation circuit 111 may cancel a change in the duty cycle that occurs in the reception circuit 120 by generating in advance a change in the duty cycle which is complementary to a change in the duty cycle that occurs in the reception circuit 120.

The duty offset generation circuit 111 may include a plurality of driver circuits. The plurality of driver circuits may have different duty cycle offsets. The level shifting circuit 121 may include a plurality of level shifters. The plurality of level shifters may generate a plurality of shifted signals, respectively, by changing the voltage level of the transmission signal TS. The plurality of level shifters may have different duty cycle offsets. The plurality of driver circuits and the plurality of level shifters will be more specifically described hereinafter.

Figure 2:
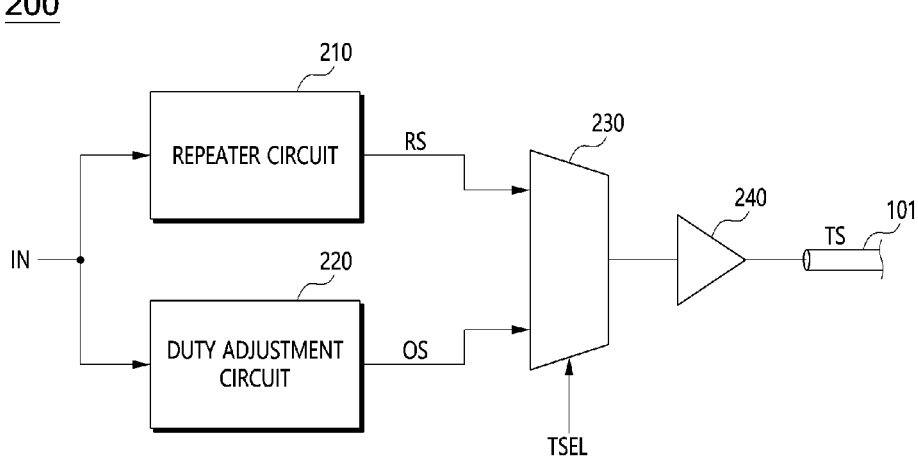
FIG. 2 is a diagram illustrating a configuration of a transmission circuit according to an embodiment.

FIG. 2 is a diagram illustrating a configuration of a transmission circuit 200 according to an embodiment. The transmission circuit 200 may be applied as the transmission circuit 110 illustrated in FIG. 1. Referring to FIG. 2, the transmission circuit 200 may include a repeater circuit 210, a duty adjustment circuit 220, and a transmission selection circuit 230. The repeater circuit 210 and the duty adjustment circuit 220 may correspond to a plurality of driver circuits included in the duty offset generation circuit 111. In an embodiment, for example, the repeater circuit 210 and the duty adjustment circuit 220 may correspond to a plurality of driver circuits included in the duty offset generation circuit 111. In an embodiment, the plurality of driver circuits may have different duty cycle offsets and each may be configured to drive an input signal IN. In an embodiment, the transmission circuit 200 may be configured to generate a transmission signal TS from one of output signals of the plurality of driver circuits based on a transmission control signal TSEL. The repeater circuit 210 may receive an input signal IN and generate a first signal RS based on the input signal IN. The repeater circuit 210 may generate the first signal RS by buffering the input signal IN. The repeater circuit 210 may generate the first signal RS having substantially the same duty cycle as the input signal IN without adjusting the duty cycle of the input signal IN. In an embodiment, the duty cycle of the first signal RS may have a slight difference from the duty cycle of the input signal IN due to an inherent duty cycle offset of the repeater circuit 210.

The duty adjustment circuit 220 may receive the input signal IN and generate a second signal OS based on the input signal IN. The duty adjustment circuit 220 may generate the second signal OS by changing the duty cycle of the input signal IN. The second signal OS may have a duty cycle different from the input signal IN. For example, the duty adjustment circuit 220 may generate the second signal OS having a greater duty cycle than the input signal IN by increasing the high level interval of the input signal IN. To the contrary, the duty adjustment circuit 220 may generate the second signal OS having a smaller duty cycle than the input signal IN by decreasing the high level interval of the input signal IN. An amount of change in the duty cycle of the duty adjustment circuit 220 may be greater than an amount of change in the inherent duty cycle of the repeater circuit 210.

The transmission selection circuit 230 may receive the first and second signals RS and OS from the repeater circuit 210 and the duty adjustment circuit 220, respectively, and may receive a transmission control signal TSEL. The transmission selection circuit 230 may output one of the first and second signals RS and OS based on the transmission control signal TSEL. The logic level of the transmission control signal TSEL may be changed by considering the duty cycle offsets of the transmission circuit 200 and the reception circuit 120 so that the duty cycle offsets of the transmission circuit 200 and the reception circuit 120 of FIG. 1 can be canceled. The transmission selection circuit 230 may output the first signal RS when the transmission control signal TSEL has a first logic level. The transmission selection circuit 230 may output the second signal OS when the transmission control signal TSEL has a second logic level.

The transmission circuit 200 may generate the transmission signal TS from the output signal of the transmission selection circuit 230. The transmission circuit 200 may further include a transmission driver 240. The transmission driver 240 may receive the output signal of the transmission selection circuit 230. The transmission driver 240 may generate the transmission signal TS based on the output signal of the transmission selection circuit 230. The transmission driver 240 may generate the transmission signal TS by driving the output signal of the transmission selection circuit 230. The transmission driver 240 may be coupled to the signal transmission line 101, and may output the transmission signal TS by driving the signal transmission line 101 based on the output signal of the transmission selection circuit 230.

When the transmission control signal TSEL has a first logic level, the transmission selection circuit 230 may output the first signal RS generated by the repeater circuit 210. The transmission driver 240 may generate the transmission signal TS based on the first signal RS. Accordingly, the transmission circuit 200 may generate the transmission signal TS having substantially the same duty cycle as the input signal IN without substantially changing the duty cycle of the input signal IN. When the transmission control signal TSEL has a second logic level, the transmission selection circuit 230 may output the second signal OS generated by the duty adjustment circuit 220. The transmission driver 240 may generate the transmission signal TS based on the second signal OS. The second signal OS may have a duty cycle different from the duty cycle of the input signal IN. The second signal OS may have a greater duty cycle than the input signal IN, or may have a smaller duty cycle than the input signal IN. The transmission circuit 200 may generate the transmission signal TS having a changed duty cycle by changing the duty cycle of the input signal IN.

Figure 3A:
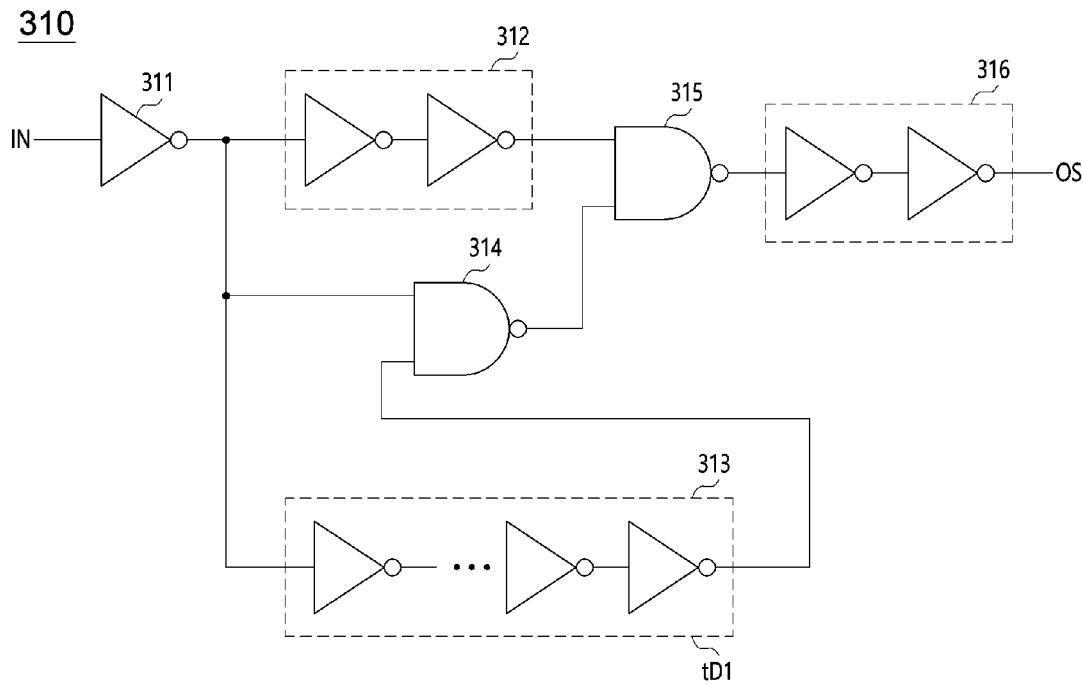
FIG. 3A is a diagram illustrating a configuration of a duty adjustment circuit according to an embodiment.

FIG. 3A is a diagram illustrating a configuration of a duty adjustment circuit 310 according to an embodiment. The duty adjustment circuit 310 may be applied as the duty adjustment circuit 220 of FIG. 2. Referring to FIG. 3A, the duty adjustment circuit 310 may receive the input signal IN and generate the second signal OS by adjusting the duty cycle of the input signal IN. The duty adjustment circuit 310 may generate the second signal OS having a greater duty cycle than the input signal IN by increasing the duty cycle of the input signal IN.

The duty adjustment circuit 310 may include an inverter 311, a first buffer 312, a delay circuit 313, a first NAND gate 314, a second NAND gate 315, and a second buffer 316. The inverter 311 may receive the input signal IN and invert the input signal IN. The first buffer 312 may receive the output signal of the inverter 311 and buffer the output signal of the inverter 311. The first buffer 312 may include an even number of inverters. The delay circuit 313 may receive the output signal of the inverter 311 and delay the output signal of the inverter 311 by a first delay time tD1. The first delay time tD1 may be variously changed in order to adjust the duty cycle offset and/or variance in the duty cycle of the duty adjustment circuit 310. The delay circuit 313 may include an odd number of inverters. As the number of inverters that constitute the delay circuit 313 is increased, the duty cycle offset and/or amount of change in the duty cycle of the duty adjustment circuit 310 may be increased. As the number of inverters that constitute the delay circuit 313 is decreased, the duty cycle offset and/or amount of change in the duty cycle of the duty adjustment circuit 310 may be decreased.

The first NAND gate 314 may receive the output signal of the inverter 311 and the output signal of the delay circuit 313. The second NAND gate 315 may receive the output signal of the first buffer 312 and the output signal of the first NAND gate 314. The second buffer 316 may receive the output signal of the second NAND gate 315, and may generate the second signal OS by buffering the output signal of the second NAND gate 315. The second buffer 316 may include an even number of inverters.

Figure 3B:
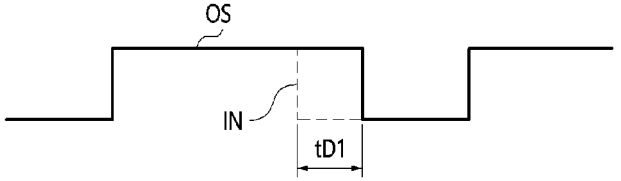
FIG. 3B is a timing diagram illustrating an operation of the duty adjustment circuit illustrated in FIG. 3A according to an embodiment.

FIG. 3B is a timing diagram illustrating an operation of the duty adjustment circuit 310 illustrated in FIG. 3A. When the logic level of the input signal IN is changed from a low logic level to a high logic level, the logic level of the output signal of the second NAND gate 315 may be directly changed from a low logic level to a high logic level. In contrast, when the logic level of the input signal IN is changed from a high logic level to a low logic level, the output signal of the second NAND gate 315 may be delayed by the first delay time tD1, and the logic level of the output signal of the second NAND gate 315 may be changed from a high logic level to a low logic level. As illustrated in FIG. 3B, the duty adjustment circuit 310 may generate the second signal OS having a high level interval, which has been increased more than the input signal IN indicated by a dotted line by the first delay time tD1. The second signal OS may have a greater duty cycle than the input signal IN.

Figure 3C:
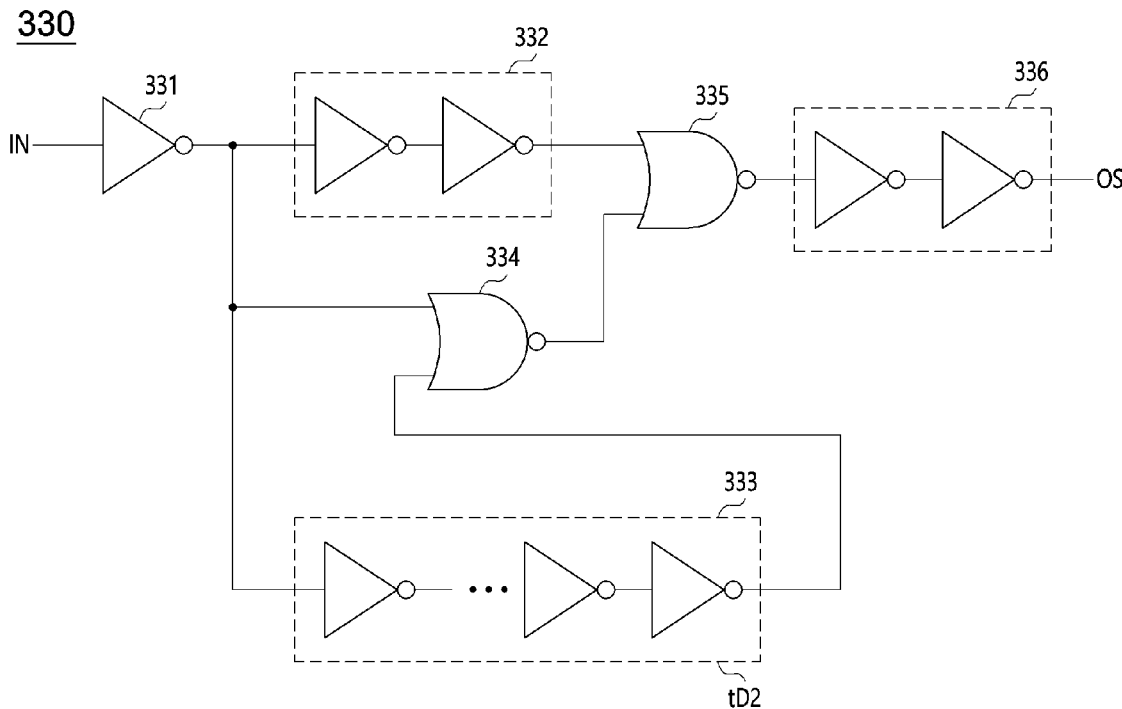
FIG. 3C is a diagram illustrating a configuration of a duty adjustment circuit according to an embodiment.

FIG. 3C is a diagram illustrating a configuration of a duty adjustment circuit 330 according to an embodiment. The duty adjustment circuit 330 may be applied as the duty adjustment circuit 220 of FIG. 2. Referring to FIG. 3C, the duty adjustment circuit 330 may receive the input signal IN and generate the second signal OS by adjusting the duty cycle of the input signal IN. The duty adjustment circuit 330 may generate the second signal OS having a smaller duty cycle than the input signal IN by reducing the duty cycle of the input signal IN.

The duty adjustment circuit 330 may include an inverter 331, a first buffer 332, a delay circuit 333, a first NOR gate 334, a second NOR gate 335, and a second buffer 336. The inverter 331 may receive the input signal IN and invert the input signal IN. The first buffer 332 may receive the output signal of the first inverter 331 and buffer the output signal of the inverter 331. The first buffer 332 may include an even number of inverters. The delay circuit 333 may receive the output signal of the inverter 331 and delay the output signal of the inverter 331 by a second delay time tD2. The second delay time tD2 may be variously changed to adjust the duty cycle offset and/or amount of change in the duty cycle of the duty adjustment circuit 330. The delay circuit 333 may include an odd number of inverters. As the number of inverters that constitute the delay circuit 333 is increased, the duty cycle offset and/or amount of change in the duty cycle of the duty adjustment circuit 330 may be increased. As the number of inverters that constitute the delay circuit 333 is decreased, the duty cycle offset and/or amount of change in the duty cycle of the duty adjustment circuit 330 may be decreased.

The first NOR gate 334 may receive the output signal of the inverter 331 and the output signal of the delay circuit 333. The second NOR gate 335 may receive the output signal of the first buffer 332 and the output signal of the first NOR gate 334. The second buffer 336 may receive the output signal of the second NOR gate 335, and may generate the second signal OS by buffering the output signal of the second NOR gate 335. The second buffer 336 may include an even number of inverters.

Figure 3D:
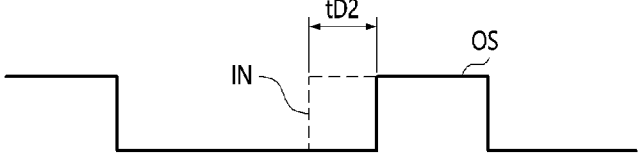
FIG. 3D is a timing diagram illustrating an operation of the duty adjustment circuit illustrated in FIG. 3C according to an embodiment.

FIG. 3D is a timing diagram illustrating an operation of the duty adjustment circuit 330 illustrated in FIG. 3C. When the logic level of the input signal IN is changed from a high logic level to a low logic level, the logic level of the output signal of the second NOR gate 335 may be directly changed from a high logic level to a low logic level. In contrast, when the logic level of the input signal IN is changed from a low logic level to a high logic level, the output signal of the second NOR gate 335 may be delayed by the second delay time tD2, and the logic level of the output signal of the second NOR gate 335 may be changed from a low logic level to a high logic level. As illustrated in FIG. 3D, the duty adjustment circuit 330 may generate the second signal OS having a high level interval, which has been decreased more than the input signal IN indicated by a dotted line by the second delay time tD2, or the second signal OS having a low level interval, which has been increased more than the input signal IN by the second delay time tD2. The second signal OS may have a smaller duty cycle than the input signal IN.

Figure 4:
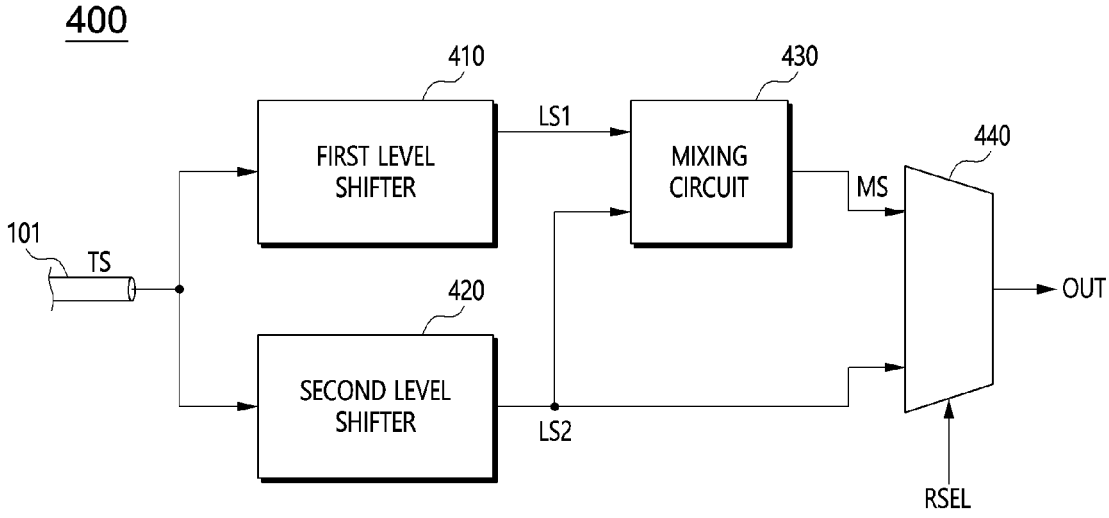
FIG. 4 is a diagram illustrating a configuration of a reception circuit according to an embodiment.

FIG. 4 is a diagram illustrating a configuration of a reception circuit 400 according to an embodiment. The reception circuit 400 may be applied as the reception circuit 120 illustrated in FIG. 1. Referring to FIG. 4, the reception circuit 400 may include a first level shifter 410, a second level shifter 420, a mixing circuit 430, and a reception selection circuit 440. The first and second level shifters 410 and 420 may constitute a plurality of level shifters included in the level shifting circuit 121 of FIG. 1. The first level shifter 410 may be coupled to the signal transmission line 101, and may receive the transmission signal TS. The first level shifter 410 may generate a first shifted signal LS1 by changing the voltage level of the transmission signal TS. The first level shifter 410 may convert the transmission signal TS having the first power domain to the first shifted signal LS1 having the second power domain. The second level shifter 420 may be coupled to the signal transmission line 101, and may receive the transmission signal TS. The second level shifter 420 may generate a second shifted signal LS2 by changing the voltage level of the transmission signal TS. The second level shifter 420 may convert the transmission signal TS having the first power domain to the second shifted signal LS2 having the second power domain. The first level shifter 410 and the second level shifter 420 may have different duty cycle offsets.

In an embodiment, the direction of a change in the duty cycle of the first level shifter 410 may be opposite to the direction of a change in the duty cycle of the second level shifter 420. For example, when the first level shifter 410 increases the duty cycle of the transmission signal TS, the second level shifter 420 may decrease the duty cycle of the transmission signal TS. The first level shifter 410 may generate the first shifted signal LS1 having a greater duty cycle than the transmission signal TS by increasing the high level interval of the transmission signal TS. The second level shifter 420 may generate the second shifted signal LS2 having a smaller duty cycle than the transmission signal TS by increasing the low level interval of the transmission signal TS. To the contrary, when the first level shifter 410 decreases the duty cycle of the transmission signal TS, the second level shifter 420 may increase the duty cycle of the transmission signal TS. The first level shifter 410 may generate the first shifted signal LS1 having a smaller duty cycle than the transmission signal TS by increasing the low level interval of the transmission signal TS. The second level shifter 420 may generate the second shifted signal LS2 having a greater duty cycle than the transmission signal TS by increasing the high level interval of the transmission signal TS. In this case, an amount of change in the duty cycle of the first level shifter 410 may be substantially the same as or different from an amount of change in the duty cycle of the second level shifter 420.

In an embodiment, the direction of a change in the duty cycle of the first level shifter 410 may be the same as the direction of a change in the duty cycle of the second level shifter 420. For example, both the first and second level shifters 410 and 420 may increase the duty cycle of the transmission signal TS or may decrease the duty cycle of the transmission signal TS. The first and second level shifters 410 and 420 may generate the first and second shifted signals LS1 and LS2, respectively, each one having a greater duty cycle than the transmission signal TS, by increasing the high level interval of the transmission signal TS. To the contrary, the first and second level shifters 410 and 420 may generate the first and second shifted signals LS1 and LS2, respectively, each one having a smaller duty cycle than the transmission signal TS, by increasing the low level interval of the transmission signal TS. In this case, an amount of change in the duty cycle of the first level shifter 410 may be different from an amount of change in the duty cycle of the second level shifter 420. For example, an amount of change in the duty cycle of the first level shifter 410 may be greater than an amount of change in the duty cycle of the second level shifter 420. To the contrary, an amount of change in the duty cycle of the second level shifter 420 may be greater than an amount of change in the duty cycle of the first level shifter 410.

The mixing circuit 430 may mix the duty cycle offset of the first level shifter 410 and the duty cycle offset of the second level shifter 420. The mixing circuit 430 may additionally adjust the duty cycle offset of the reception circuit 400 by mixing the duty cycle offsets of the first and second level shifters 410 and 420. The mixing circuit 430 may receive the first and second shifted signals LS1 and LS2 from the first and second level shifters 410 and 420, respectively. The mixing circuit 430 may generate a mixed signal MS by mixing the first and second shifted signals LS1 and LS2. The mixing circuit 430 may generate the mixed signal MS having a duty cycle between the duty cycle of the first shifted signal LS1 and the duty cycle of the second shifted signal LS2 by mixing the first and second shifted signals LS1 and LS2. For example, the mixing circuit 430 may mix the first shifted signal LS1 and the second shifted signal LS2 at a ratio of 1 to 1. The mixed signal MS may have a duty cycle corresponding to the middle of the duty cycles of the first and second shifted signals LS1 and LS2. In an embodiment, the mixing circuit 430 may mix the first and second shifted signals LS1 and LS2 at a ratio different from the ratio of 1 to 1. To variously adjust the duty cycle offset of the reception circuit 400, the mixing ratio of the mixing circuit 430 may also be variously changed.

The reception selection circuit 440 may receive the mixed signal MS from the mixing circuit 430 and receive the second shifted signal LS2 from the second level shifter 420. The reception selection circuit 440 may receive a reception control signal RSEL. The reception selection circuit 440 may output one of the mixed signal MS and the second shifted signal LS2 as an output signal OUT based on the reception control signal RSEL. The logic level of the reception control signal RSEL may be changed by considering the duty cycle offsets of the transmission circuit 110 and the reception circuit 400 so that the duty cycle offsets of the transmission circuit 110 of FIG. 1 and the reception circuit 400 can be canceled. For example, when the reception control signal RSEL has a first logic level, the reception selection circuit 440 may output the second shifted signal LS2 as the output signal OUT. When the reception control signal RSEL has a second logic level, the reception selection circuit 440 may output the mixed signal MS as the output signal OUT.

Figure 5A:
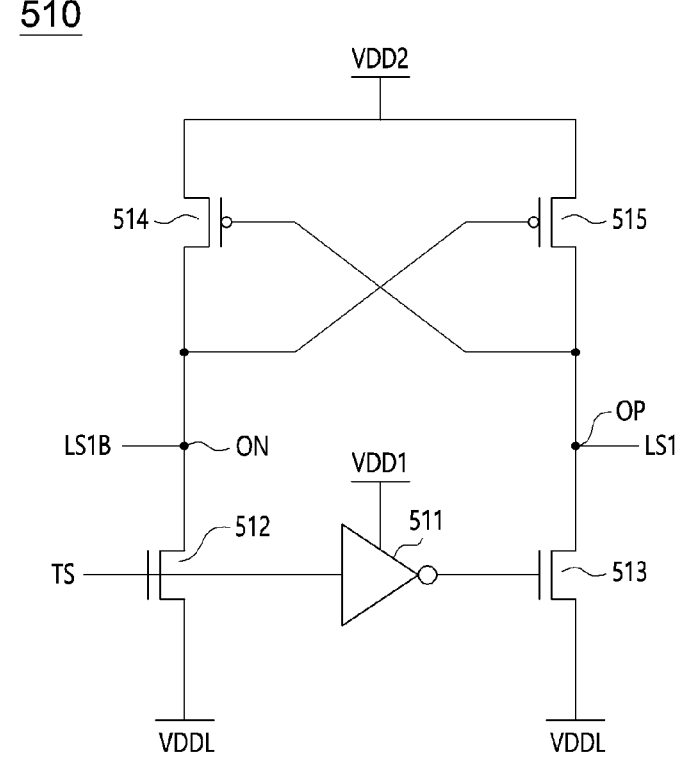
FIG. 5A is a diagram illustrating a configuration of a level shifter according to an embodiment.

FIG. 5A is a diagram illustrating a configuration of a level shifter 510 according to an embodiment. The level shifter 510 may be applied as at least one of the first level shifter 410 and the second level shifter 420 in FIG. 4. When the level shifter 510 is applied as the first level shifter 410, the level shifter 510 may generate the first shifted signal LS1 and a complementary signal LS1B by receiving the transmission signal TS. The level shifter 510 may convert the transmission signal TS having the first power domain to the first shifted signal LS1 having the second power domain. The level shifter 510 may include an inverter 511, a first transistor 512, a second transistor 513, a third transistor 514, and a fourth transistor 515. The inverter 511 may receive the transmission signal TS and invert the transmission signal TS. The inverter 511 may receive the first high power supply voltage VDD1. The inverter 511 may invert and drive the transmission signal TS between the first high power supply voltage VDD1 and the low power supply voltage VDDL. The first and second transistors 512 and 513 may each be an N channel MOS transistor. The gate of the first transistor 512 may receive the first transmission signal TS. The drain of the first transistor 512 may be coupled to a negative output node ON. The source of the first transistor 512 may be coupled to a terminal to which the low power supply voltage VDDL is supplied. The complementary signal LS1B may be output from the negative output node ON. The gate of the second transistor 513 may receive the output signal of the inverter 511. The drain of the second transistor 513 may be coupled to a positive output node OP. The source of the second transistor 513 may be coupled to a terminal to which the low power supply voltage VDDL is supplied. The first shifted signal LS1 may be output from the positive output node OP. The third and fourth transistors 514 and 515 may each be a P channel MOS transistor. The gate of the third transistor 514 may be coupled to the positive output node OP. The source of the third transistor 514 may receive the second high power supply voltage VDD2. The drain of the third transistor 514 may be coupled to the negative output node ON. The gate of the fourth transistor 515 may be coupled to the negative output node ON. The source of the fourth transistor 515 may receive the second high power supply voltage VDD2. The drain of the fourth transistor 515 may be coupled to the positive output node OP. The duty cycle offset of the level shifter 510 may be variously changed depending on the voltage levels of the first and second high power supply voltages VDD1 and VDD2 and the sizes of the first to fourth transistors 512, 513, 514, and 515. The size of the transistor may be a ratio of the channel width to channel length of the transistor. Each of the first and second level shifters 410 and 420 in FIG. 4 may have substantially the same configuration as the level shifter 510. However, the size of a transistor that constitutes the first level shifter 410 may be different from the size of a transistor that constitutes the second level shifter 420 so that the first and second level shifters 410 and 420 have different duty cycle offsets.

Figure 5B:
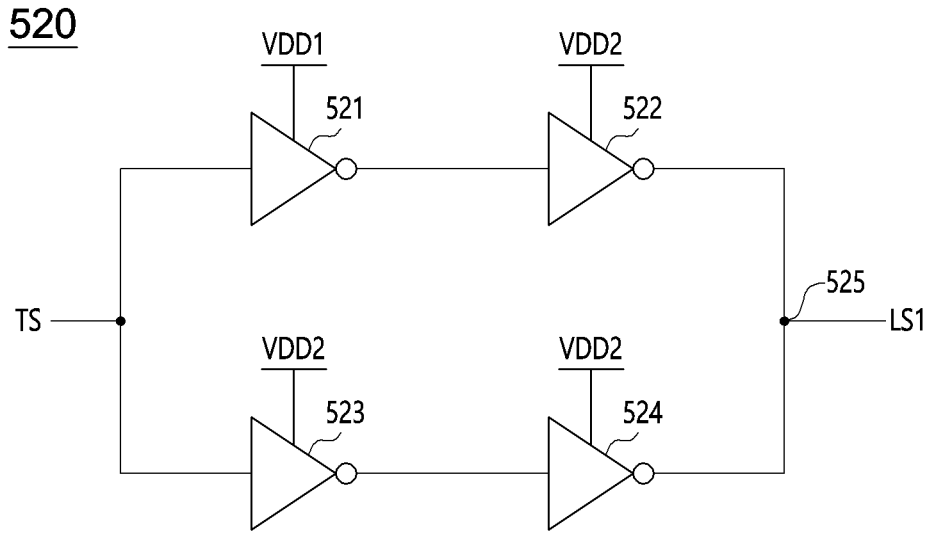
FIG. 5B is a diagram illustrating a configuration of a level shifter according to an embodiment.

FIG. 5B is a diagram illustrating a configuration of a level shifter 520 according to an embodiment. The level shifter 520 may be applied as at least one of the first and second level shifters 410 and 420 in FIG. 4. When the level shifter 520 is applied as the first level shifter 410, the level shifter 520 may generate the first shifted signal LS1 by receiving the transmission signal TS. The level shifter 520 may convert the transmission signal TS having the first power domain to the first shifted signal LS1 having the second power domain. The level shifter 520 may include a first inverter 521, a second inverter 522, a third inverter 523, and a fourth inverter 524. The first inverter 521 may receive the first high power supply voltage VDD1. The second to fourth inverters 522, 523, and 524 may receive the second high power supply voltage VDD2. The first inverter 521 may receive the transmission signal TS, and may invert and drive the transmission signal TS. The output signal of the first inverter 521 may have a voltage level between the first high power supply voltage VDD1 and the low power supply voltage VDDL. The second inverter 522 may receive the output signal of the first inverter 521, and may invert and drive the output signal of the first inverter 521. The output signal of the second inverter 522 may have a voltage level between the second high power supply voltage VDD2 and the low power supply voltage VDDL. The third inverter 523 may receive the transmission signal TS, and may invert and drive the transmission signal TS. The output signal of the third inverter 523 may have a voltage level between the second high power supply voltage VDD2 and the low power supply voltage VDDL. The fourth inverter 524 may receive the output signal of the third inverter 523, and may invert and drive the output signal of the third inverter 523. The output signal of the fourth inverter 524 may have a voltage level between the second high power supply voltage VDD2 and the low power supply voltage VDDL. The output signals of the third inverter 523 and the fourth inverter 524 may be mixed in an output node 525. The first shifted signal LS1 may be output through the output node 525. The duty cycle offset of the level shifter 520 may be variously changed depending on the voltage levels of the first and second high power supply voltages VDD1 and VDD2 and the size of a transistor that constitutes the first to fourth inverters 521, 522, 523, and 524. The first and second level shifters 410 and 420 in FIG. 4 may have substantially the same configuration as the level shifter 520. However, the size of a transistor that constitutes the first level shifter 410 may be different from the size of a transistor that constitutes the second level shifter 420 so that the first and second level shifters 410 and 420 may have different duty cycle offsets.

Figure 6:
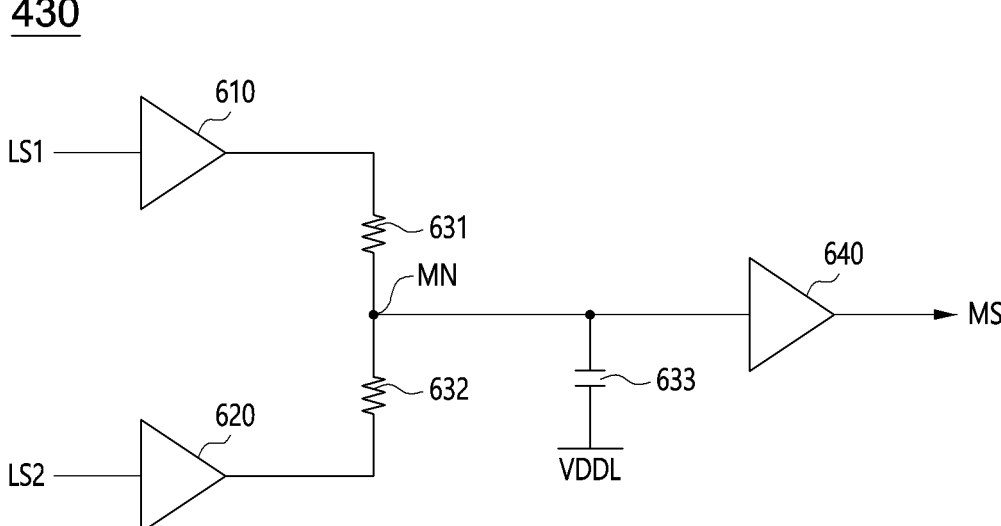
FIG. 6 is a diagram illustrating a configuration of a mixing circuit illustrated in FIG. 4 according to an embodiment.

FIG. 6 is a diagram illustrating a configuration of the mixing circuit 430 illustrated in FIG. 4. Referring to FIG. 6, the mixing circuit 430 may include a first buffer 610, a second buffer 620, a first resistor 631, a second resistor 632, a capacitor 633, and a third buffer 640. The first buffer 610 may receive the first shifted signal LS1 from the first level shifter 410, and may buffer the first shifted signal LS1. The second buffer 620 may receive the second shifted signal LS2 from the second level shifter 420, and may buffer the second shifted signal LS2. The first resistor 631 may be coupled between the first buffer 610 and a mixing node MN. One end of the first resistor 631 may receive the output signal of the first buffer 610. The other end of the first resistor 631 may be coupled to the mixing node MN. The second resistor 632 may be coupled between the second buffer 620 and the mixing node MN. One end of the second resistor 632 may receive the output signal of the second buffer 620. The other end of the second resistor 632 may be coupled to the mixing node MN. The capacitor 633 may be coupled to the mixing node MN. One end of the capacitor 633 may be coupled to the mixing node MN. The other end of the capacitor 633 may be coupled to a terminal to which the low power supply voltage VDDL is supplied. The output signals of the first and second buffers 610 and 620 may be mixed at the mixing node MN through the first and second resistors 631 and 632. For example, the current driving force of the first buffer 610 may be substantially the same as the current driving force of the second buffer 620. The resistance value of the first resistor 631 may be substantially the same as the resistance value of the second resistor 632. The first and second shifted signals LS1 and LS2 may be mixed at the ratio of 1 to 1 at the mixing node MN. If the current driving forces of the first and second buffers 610 and 620 and/or the resistance values of the first and second resistors 631 and 632 are differently adjusted, the first and second shifted signals LS1 and LS2 may be mixed at a ratio not the ratio of 1 to 1 at the mixing node MN.

An operation of the transmission and reception system 100 according to an embodiment may be described as follows with reference to FIGS. 1, 2, and 4. When the duty cycle offsets of the transmission circuits 110 and 200 are not what was intended, the transmission circuit 200 may generate the transmission signal TS by outputting the first signal RS that is output by the repeater circuit 210. The reception circuits 120 and 400 may generate the first and second shifted signals LS1 and LS2 by shifting the voltage level of the transmission signal TS. The reception selection circuit 440 may output, as the output signal OUT, the mixed signal MS that is generated by the mixing circuit 430. The reception circuit 400 may generate the output signal OUT having a duty cycle of 50% by generating the output signal OUT from the mixed signal MN so that the duty cycle offset of the transmission circuit 200 is canceled.

When the transmission circuit 200 changes the duty cycle of the input signal IN through the duty adjustment circuit 220, the transmission circuit 200 may generate the transmission signal TS having a changed duty cycle based on the duty cycle offset of the duty adjustment circuit 220. In this case, the duty cycle offset of the duty adjustment circuit 220 may be complementary to the duty cycle offset of the second level shifter 420. The second level shifter 420 of the reception circuit 400 may generate the second shifted signal LS2 by shifting the voltage level of the transmission signal TS. The reception selection circuit 440 may output the second shifted signal LS2 as the output signal OUT. The reception circuit 400 may offset the duty cycle offset of the transmission circuit 200 by outputting the second shifted signal LS2 as the output signal OUT. The output signal OUT may have a duty cycle of 50%.

When variance in the duty cycle of the duty adjustment circuit 220 is greater than or smaller than variance in the duty cycle of the second level shifter 420, the reception circuit 400 may generate the output signal OUT based on the mixed signal MS. The transmission and reception system 100 may generate the output signal OUT having substantially the same duty cycle as the input signal IN because the duty cycle offset of the duty adjustment circuit 220, the duty cycle offset of the first level shifter 410, and the duty cycle offset of the second level shifter 420 are adjusted independently and variously.

Figure 7:
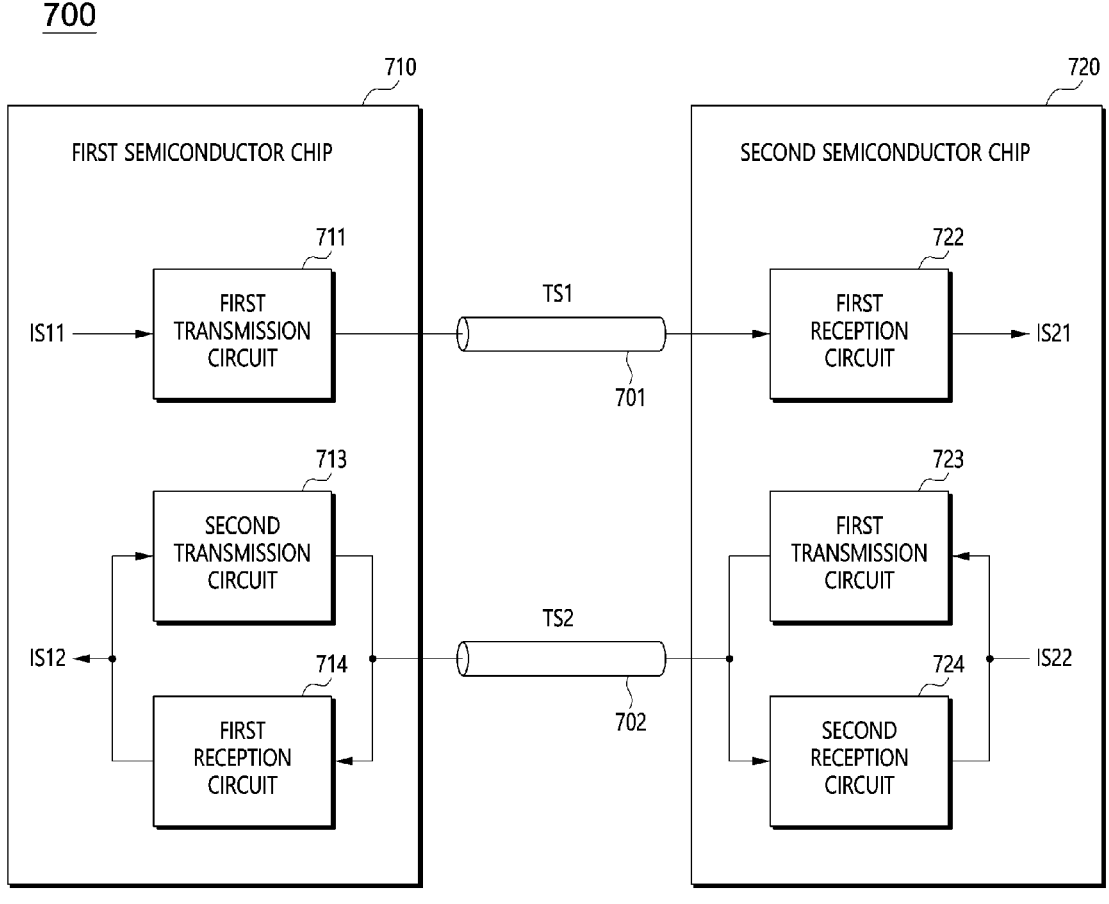
FIG. 7 is a diagram illustrating a configuration of a semiconductor apparatus according to an embodiment.

FIG. 7 is a diagram illustrating a configuration of a semiconductor apparatus 700 according to an embodiment. Referring to FIG. 7, the semiconductor apparatus 700 may include a first semiconductor chip 710 and a second semiconductor chip 720. The first semiconductor chip 710 may have substantially the same structure as the second semiconductor chip 720, and may perform the same function as the second semiconductor chip 720 or may perform a function similar to the function of the second semiconductor chip 720. In an embodiment, the first semiconductor chip 710 may have a structure different from a structure of the second semiconductor chip 720, and may perform a function different from a function of the second semiconductor chip 720. The first semiconductor chip 710 may operate in the same power domain as the second semiconductor chip 720, and may operate in a power domain different from a power domain of the second semiconductor chip 720. The semiconductor apparatus 700 may include at least one signal transmission line. The first and second semiconductor chips 710 and 720 may be coupled through at least one signal transmission line. For example, the semiconductor apparatus 710 may include a first signal transmission line 701 and a second signal transmission line 702. The first semiconductor apparatus 710 may be coupled to the second semiconductor chip 720 through the first and second signal transmission lines 701 and 702, and may communicate with the second semiconductor chip 720 through the first and second signal transmission lines 701 and 702. The first signal transmission line 701 may be a unidirectional signal path from the first semiconductor chip 710 to the second semiconductor chip 720. The second signal transmission line 702 may be a bidirectional signal path. For example, the first and second signal transmission lines 701 and 720 may each be a chiplet interconnection. The first transmission signal TS1 may be transmitted through the first signal transmission line 701. The second transmission signal TS2 may be transmitted through the second signal transmission line 702.

The first semiconductor chip 710 may include a first transmission circuit 711, a second transmission circuit 713, and a first reception circuit 714. The first transmission circuit 711 may be coupled to the first signal transmission line 701, and may generate a first transmission signal TS1 by receiving a first internal signal IS11 of the first semiconductor chip 710. The first transmission circuit 711 may transmit the first transmission signal TS1 to the second semiconductor chip 720 through the first signal transmission line 701. The second transmission circuit 713 may be coupled to the second signal transmission line 702, and may generate a second transmission signal TS2 by receiving a second internal signal IS12 of the first semiconductor chip 710. The second transmission circuit 713 may transmit the second transmission signal TS2 to the second semiconductor chip 720 through the second signal transmission line 702. The first reception circuit 714 may be coupled to the second signal transmission line 702, and may receive the second transmission signal TS2 that is transmitted by the second semiconductor chip 720, through the second signal transmission line 702. The first reception circuit 714 may generate the second internal signal IS12 from the second transmission signal TS2.

The second semiconductor chip 720 may include a first reception circuit 722, a first transmission circuit 723, and a second reception circuit 724. The first reception circuit 722 may be coupled to the first signal transmission line 701, and may receive the first transmission signal TS1 that is transmitted by the first semiconductor chip 710, through the first signal transmission line 701. The first reception circuit 722 may generate a first internal signal IS21 of the second semiconductor chip 720 from the first transmission signal TS1. The first transmission circuit 723 may be coupled to the second signal transmission line 702, and may generate the second transmission signal TS2 by receiving a second internal signal IS22 of the second semiconductor chip 720. The first transmission circuit 723 may transmit the second transmission signal TS2 to the first semiconductor chip 710 through the second signal transmission line 702. The second reception circuit 724 may be coupled to the second signal transmission line 702, and may receive the second transmission signal TS2 that is transmitted by the first semiconductor chip 710, through the second signal transmission line 702. The second reception circuit 724 may generate the second internal signal IS22 from the second transmission signal TS2.

The transmission circuits 110 and 200 illustrated in FIGS. 1 and 2 may each be applied as the first transmission circuit 711. The reception circuits 120 and 400 illustrated in FIGS. 1 and 4 may each be applied as the first reception circuit 722 that is coupled to the first transmission circuit 711 through the first signal transmission line 701. The transmission circuits 110 and 200 illustrated in FIGS. 1 and 2 may each be applied as the second transmission circuit 713. The reception circuits 120 and 400 illustrated in FIGS. 1 and 4 may each be applied as the second reception circuit 724 that is coupled to the second transmission circuit 713 through the second signal transmission line 702. The transmission circuits 110 and 200 illustrated in FIGS. 1 and 2 may each be applied as the first transmission circuit 723. The reception circuits 120 and 400 illustrated in FIGS. 1 and 4 may each be applied as the first reception circuit 714 that is coupled to the first transmission circuit 723 through the second signal transmission line 702.

Figure 8:
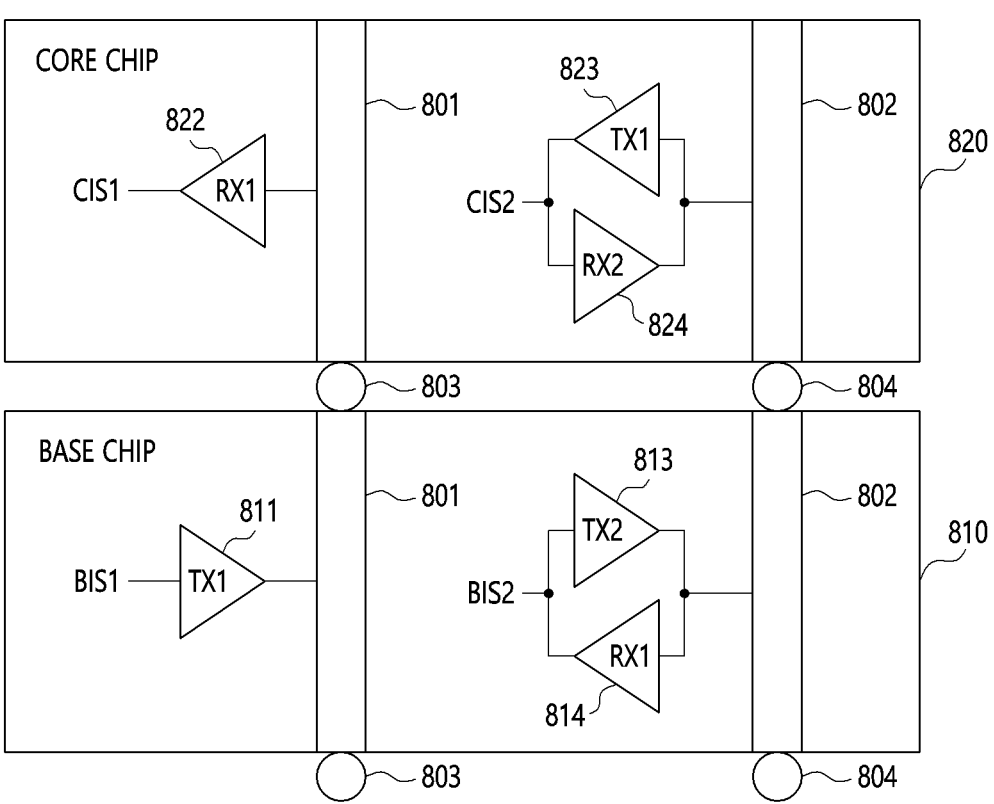
FIG. 8 is a diagram illustrating a configuration of a semiconductor apparatus according to an embodiment.

FIG. 8 is a diagram illustrating a configuration of a semiconductor apparatus 800 according to an embodiment. The semiconductor apparatus 800 may be a stacked semiconductor apparatus in which a plurality of chips and/or dies is stacked. Referring to FIG. 8, the semiconductor apparatus 800 may include a base chip 810 and a core chip 820. The semiconductor apparatus 800 may include two or more core chips. The base chip 810 may be disposed on a lower side of the semiconductor apparatus 800. The core chip 820 may be stacked over the base chip 810. The base chip 810 may function as a master chip of the semiconductor apparatus 800, and may function as an interface chip that communicates with an external device of the semiconductor apparatus 800. The core chip 820 may function as a slave chip, and may store a signal that is transmitted by the base chip 810 through communication with the base chip 810 or may output, to the base chip 810, a signal that has been stored in the core chip 820. The base chip 810 and the core chip 820 may be electrically coupled through through electrodes 801 and 802, such as, for example, a through-silicon via (TSV). A signal that is received from the external device may be provided from the base chip 810 to the core chip 820 through the through electrodes 801 and 802. A signal that is output by the core chip 820 may be transmitted to the base chip 810 and the external device through the through electrode 802. In order to connect the through electrodes 801 and 802 of the base chip 810 and the core chip 820, bumps 803 and 804 may be disposed. In an embodiment, the bumps 803 and 804 may each be a micro bump.

The base chip 810 may include a first transmission circuit (TX1) 811, a second transmission circuit (TX2) 813, and a first reception circuit (RX1) 814. The first transmission circuit 811 may be coupled to the through electrode 801, and may transmit a first internal signal BIS1 of the base chip 810 to the core chip 820 through the through electrode 801. The second transmission circuit 813 may be coupled to the through electrode 802, and may transmit a second internal signal BIS2 of the base chip 810 to the core chip 820 through the through electrode 802. The first reception circuit 814 may be coupled to the through electrode 802, and may receive a signal that is transmitted by the core chip 820 through the through electrode 802. The first reception circuit 814 may generate the second internal signal BIS2 based on a signal that is transmitted through the through electrode 802.

The core chip 820 may include a first reception circuit (RX1) 822, a first transmission circuit (TX1) 823, and a second reception circuit (RX2) 824. The first reception circuit 822 may be coupled to the through electrode 801, and may receive a signal that is transmitted by the base chip 810 through the through electrode 801. The first reception circuit 822 may generate a first internal signal CIS1 of the core chip 820 based on a signal that is transmitted through the through electrode 801. The first transmission circuit 823 may be coupled to the through electrode 802, and may transmit a second internal signal CIS2 of the core chip 820 to the base chip 810 through the through electrode 802. The second reception circuit 824 may be coupled to the through electrode 802, and may receive a signal that is transmitted by the base chip 810 through the through electrode 802. The second reception circuit 824 may generate the second internal signal CIS2 based on a signal that is transmitted through the through electrode 802.

The transmission circuits 110 and 200 illustrated in FIGS. 1 and 2 may each be applied as the first transmission circuit 811. The reception circuits 120 and 400 illustrated in FIGS. 1 and 4 may each be applied as the first reception circuit 822 that is coupled to the first transmission circuit 811 through the through electrode 801. The transmission circuits 110 and 200 illustrated in FIGS. 1 and 2 may each be applied as the second transmission circuit 813. The reception circuits 120 and 400 illustrated in FIGS. 1 and 4 may each be applied as the second reception circuit 824 that is coupled to the second transmission circuit 813 through the through electrode 802. The transmission circuits 110 and 200 illustrated in FIGS. 1 and 2 may each be applied as the first transmission circuit 823. The reception circuits 120 and 400 illustrated in FIGS. 1 and 4 may each be applied as the first reception circuit 814 that is coupled to the first transmission circuit 823 through the through electrode 802.

Those skilled in the art to which the present technology pertains may understand that the present technology may be implemented in various other forms without departing from the technical spirit or essential characteristics of the present technology. Accordingly, it is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

What is claimed is:

1. A transmission and reception system comprising:
a transmission circuit configured to output a transmission signal based on an input signal; and
a reception circuit configured to shift a voltage level of the transmission signal to generate an output signal,
wherein the transmission circuit provides a duty cycle offset which is complementary with a duty cycle offset of the reception circuit.

2. The transmission and reception system according to claim 1, wherein the transmission circuit provides the duty cycle offset which is complementary with the duty cycle offset of the reception circuit to cancel the duty cycle offsets of the transmission circuit and reception circuit.

3. The transmission and reception system according to claim 1, wherein the transmission circuit provides a duty cycle offset which is complementary with a duty cycle offset of the reception circuit to generate the output signal having a duty cycle of substantially 50%.

4. The transmission and reception system according to claim 1, wherein:
the transmission circuit operates in a first power domain, and
the reception circuit operates in a second power domain different from the first power domain.

5. The transmission and reception system according to claim 1, wherein the transmission circuit comprises:
a repeater circuit configured to generate a first signal by buffering the input signal;
a duty adjustment circuit configured to generate a second signal by changing a duty cycle of the input signal; and
a transmission selection circuit configured to output one of the first and second signals based on a transmission control signal,
wherein the transmission circuit generates the transmission signal from the output signal of the transmission selection circuit.

6. The transmission and reception system according to claim 5, wherein the duty adjustment circuit generates the second signal having a greater duty cycle than the input signal by increasing a high level interval of the input signal.

7. The transmission and reception system according to claim 5, wherein the duty adjustment circuit generates the second signal having a smaller duty cycle than the input signal by increasing a low level interval of the input signal.

8. The transmission and reception system according to claim 1, wherein the reception circuit comprises:
a first level shifter configured to generate a first shifted signal by shifting the voltage level of the transmission signal;
a second level shifter configured to generate a second shifted signal by shifting the voltage level of the transmission signal;
a mixing circuit configured to output a mixed signal by mixing the first and second shifted signals; and
a reception selection circuit configured to generate the output signal from one of the mixed signal and the second shifted signal based on a reception control signal.

9. The transmission and reception system according to claim 8, wherein:
the first level shifter generates the first shifted signal having a greater duty cycle than the transmission signal, and
the second level shifter generates the second shifted signal having a smaller duty cycle than the transmission signal.

10. The transmission and reception system according to claim 8, wherein:
the first level shifter generates the first shifted signal having a smaller duty cycle than the transmission signal, and
the second level shifter generates the second shifted signal having a greater duty cycle than the transmission signal.

11. The transmission and reception system according to claim 8, wherein the first and second level shifters generate the first and second shifted signals, respectively, each shifted signal having a greater duty cycle than the transmission signal.

12. The transmission and reception system according to claim 11, wherein an amount of change in the duty cycle by the first level shifter is different from an amount of change in the duty cycle by the second level shifter.

13. The transmission and reception system according to claim 8, wherein the first and second level shifters generate the first and second shifted signals, respectively, each shifted signal having a smaller duty cycle than the transmission signal.

14. The transmission and reception system according to claim 13, wherein an amount of change in the duty cycle by the first level shifter is different from an amount of change in the duty cycle by the second level shifter.

15. A transmission and reception system comprising:

a transmission circuit comprising a plurality of driver circuits having different duty cycle offsets and each configured to drive an input signal, the transmission circuit being configured to generate a transmission signal from one of output signals of the plurality of driver circuits based on a transmission control signal; and a reception circuit configured to generate an output signal by shifting a voltage level of the transmission signal from a first power supply voltage to a second power supply voltage.

16. The transmission and reception system according to claim 15, wherein the plurality of driver circuits each comprises:

a repeater circuit configured to generate a first signal by buffering the input signal; and a duty adjustment circuit configured to generate a second signal by changing a duty cycle of the input signal.

17. The transmission and reception system according to claim 16, wherein the transmission circuit further comprises a transmission selection circuit configured to output one of the first and second signals based on the transmission control signal, wherein the transmission circuit is configured to generate the transmission signal from the output signal of the transmission selection circuit.

18. The transmission and reception system according to claim 15, wherein the reception circuit comprises:

a first level shifter configured to generate a first shifted signal by shifting the voltage level of the transmission signal to the second power supply voltage;

a second level shifter configured to generate a second shifted signal by shifting the voltage level of the transmission signal to the second power supply voltage;

a mixing circuit configured to output a mixed signal by mixing the first and second shifted signals; and a reception selection circuit configured to generate the output signal from one of the mixed signal and the second shifted signal based on a reception control signal.

19. The transmission and reception system according to claim 18, wherein a duty cycle offset of the first level shifter is different from a duty cycle offset of the second level shifter.

20. A transmission and reception system comprising:

a transmission circuit configured to generate a transmission signal based on an input signal; and a reception circuit comprising a plurality of level shifters having different duty cycle offsets, and each configured to receive the transmission signal in common and to shift a voltage level of the transmission signal, the reception circuit being configured to generate an output signal based on at least one of output signals of the plurality of level shifters.

21. The transmission and reception system according to claim 20, wherein the transmission circuit comprises:

a repeater circuit configured to generate a first signal by buffering the input signal;

a duty adjustment circuit configured to generate a second signal by changing a duty cycle of the input signal; and a transmission selection circuit configured to output one of the first and second signals based on a transmission control signal, wherein the transmission circuit generates the transmission signal from the output signal of the transmission selection circuit.

22. The transmission and reception system according to claim 20, wherein the plurality of level shifters comprises:

a first level shifter configured to generate a first shifted signal by shifting the voltage level of the transmission signal from a first power supply voltage to a second power supply voltage; and a second level shifter having a duty cycle offset different from a duty cycle offset of the first level shifter and configured to generate a second shifted signal by shifting the voltage level of the transmission signal from the first power supply voltage to the second power supply voltage.

23. The transmission and reception system according to claim 22, wherein the reception circuit further comprises:

a mixing circuit configured to output a mixed signal by mixing the first and second shifted signals; and a reception selection circuit configured to generate the output signal from one of the mixed signal and the second shifted signal based on a reception control signal.

24. The transmission and reception system according to claim 1, wherein the transmission circuit is configured to generate the transmission signal having a duty cycle different from a duty cycle of the input signal, and wherein the reception circuit is configured to generate the output signal having a duty cycle substantially the same as the duty cycle of the input signal.

25. The transmission and reception system according to claim 15, wherein the output signals of the plurality of driver circuits have different duty cycles with each other.

* * * * *